(12) United States Patent
Fischer et al.

(10) Patent No.: US 9,293,926 B2
(45) Date of Patent: Mar. 22, 2016

(54) PLASMA PROCESSING SYSTEMS HAVING MULTI-LAYER SEGMENTED ELECTRODES AND METHODS THEREFOR

(71) Applicant: LAM RESEARCH CORPORATION, Fremont, CA (US)

(72) Inventors: Andreas Fischer, Fremont, CA (US); Dave Jacob, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 602 days.

(21) Appl. No.: 13/689,679

(22) Filed: Nov. 29, 2012

(65) Prior Publication Data
US 2014/0139049 A1   May 22, 2014

Related U.S. Application Data

(60) Provisional application No. 61/729,066, filed on Nov. 21, 2012.

(51) Int. Cl.
| | |
|---|---|
| *H01L 21/683* | (2006.01) |
| *H02J 4/00* | (2006.01) |
| *B44C 1/22* | (2006.01) |
| *H01J 37/32* | (2006.01) |

(52) U.S. Cl.
CPC . *H02J 4/00* (2013.01); *B44C 1/227* (2013.01); *H01J 37/3255* (2013.01); *H01J 37/32532* (2013.01); *H01J 37/32532* (2013.01); *H01J 37/32541* (2013.01)

(58) Field of Classification Search
CPC ............... H01J 37/32532; B44C 1/227; H01J 37/32091
See application file for complete search history.

(56) References Cited

U.S. PATENT DOCUMENTS

| | | | |
|---|---|---|---|
| 5,151,845 A * | 9/1992 | Watanabe et al. | 361/234 |
| 2004/0194890 A1* | 10/2004 | Moroz | 156/345.48 |
| 2005/0130620 A1* | 6/2005 | Fischer | 455/333 |
| 2005/0213279 A1* | 9/2005 | Hayakawa | 361/234 |
| 2010/0025372 A1* | 2/2010 | Tsujimoto et al. | 216/71 |
| 2011/0096461 A1* | 4/2011 | Yoshikawa et al. | 361/234 |

\* cited by examiner

*Primary Examiner* — Thienvu Tran
*Assistant Examiner* — Tien Mai
(74) *Attorney, Agent, or Firm* — Martine Penilla Group, LLP

(57) ABSTRACT

Methods and apparatus for plasma processing of a substrate to improve process results are proposed. The apparatus pertains to multi-layer segmented electrodes and methods to form and operate such electrodes. The multi-layer segmented electrode includes a first layer comprising a first plurality of electrode segments, whereby electrode segments of the first plurality of electrode segments spatially separated from one another along a first direction. There is also included a second layer comprising a second plurality of electrode segments, whereby the second layer is spatially separated from the first layer along a second direction perpendicular to the first direction and whereby at least two segmented electrodes of the first plurality of electrode segments are individually controllable with respect to one or more electrical parameters.

27 Claims, 6 Drawing Sheets

PLASMA PROCESSING SYSTEMS HAVING MULTI-LAYER SEGMENTED ELECTRODES AND METHODS THEREFOR

CROSS REFERENCE TO RELATED APPLICATIONS

This application claims priority from U.S. Provisional Patent Application No. 61/729,066 filed on Nov. 21, 2012 and entitled "Plasma Processing Systems Having Multi-Layer Segmented Electrodes and Methods Therefor," which is incorporated herein by reference in its entirety for all purposes.

BACKGROUND OF THE INVENTION

The present invention relates generally to substrate processing technologies. More particularly, embodiments of the invention relate to methods and apparatuses for processing substrates (e.g., silicon-based wafers or wafers based on other types of material) in a plasma processing chamber.

Generally speaking, the substrate may be processed in a series of steps in which substrate materials are selectively removed (etched) or deposited or otherwise processed. The processed substrate (or dies cut from the processed substrate) may then be employed to form a variety of electronic devices, such as display panels or integrated circuits for example. Substrate processing technologies in general are well-known and will not be further elaborated here for brevity's sake.

Plasma-enhanced processing is also well-known and has proven to be particularly suitable for forming the extremely small and/or fine features required in modern electronic devices. Plasma etching, for example, employs plasma formed from a process gas (which may be a single gas or a mixture of different gases) to selectively etch material from exposed (e.g., unmasked) areas of the substrate. Various plasma generation technologies have been employed to form the plasma, including for example capacitively coupled plasma generation, inductively coupled plasma generation, ECR (electron-cyclotron resonance), microwave, and/or hybrids thereof.

In a typical capacitively coupled plasma (CCP) processing chamber, for example, two or more electrodes are disposed in a spatially separated manner, with at least one of the electrodes powered by one or more RF generator(s). In an example configuration, two electrodes are employed, with the chuck (substrate support) powered by an RF power supply via an RF match. The other electrode may, for example, be grounded and may be disposed above and in a spaced-apart relationship with the substrate (with the substrate disposed on the aforementioned chuck). In an example configuration, the space between the two electrodes may be further confined by a set of confinement rings in order to define a plasma generation region. Process gas is injected into this plasma generation region to be ignited into a plasma to process the substrate.

To facilitate discussion, FIG. 1 shows a highly simplified drawing of an example capacitively coupled plasma (CCP) processing chamber 102 having a powered lower electrode/chuck 104 and an RF supply 120. A substrate 106 is shown disposed on lower electrode/chuck 104 during substrate processing. An upper electrode 108 is shown disposed above and in a spaced-apart manner from substrate 106, conceptually forming a plasma generation region 110 in which plasma 112 may be formed from injected process gas (not shown to simplify the drawing).

Optional confinement rings 114 may be provided to confine plasma 112 in plasma generation region 110 as well as to control the pressure within plasma generation region 110. The CCP chamber 102 of FIG. 1 is highly simplified, as mentioned, and variations exist with respect to, for example, the type of chuck employed, the manner with which the process gas is injected, the manner with which pressure is controlled, the number of electrodes, the location of the electrodes, the number and frequencies of the RF power supplies, etc. Irrespective, capacitively coupled plasma processing chambers and their variations are well known.

Generally speaking, a larger substrate yields a larger number of cut dies. To increase production output (e.g., a greater number of electronic devices manufactured per unit of time), manufacturers strive to employ large substrates whenever possible. As the substrate increases in size, it becomes more challenging to maintain an acceptable level of process result uniformity (e.g., etch rate and/or etch depth). For larger substrates (e.g., 300 mm or above) processed in capacitively coupled plasma process chambers, maintaining a satisfactory level of radial uniformity (e.g., from the center of the substrate to the edge of the substrate) has proven to be challenging.

In view of the foregoing, improved methods and apparatus for processing substrates with improved process uniformity in a plasma processing system are desired.

BRIEF SUMMARY OF THE INVENTION

The invention relates, in an embodiment, to a multi-layer segmented electrode, which includes a first layer comprising a first plurality of electrode segments, whereby electrode segments of the first plurality of electrode segments spatially separated from one another along a first direction. There is also included a second layer comprising a second plurality of electrode segments, whereby the second layer is spatially separated from the first layer along a second direction perpendicular to the first direction and whereby at least two segmented electrodes of the first plurality of electrode segments are individually controllable.

In another embodiment, the invention relates to a method for processing a substrate in a plasma processing chamber, with the substrate supported on a planar surface of a chuck during the processing. The method comprises providing a multi-layer segmented electrode that includes at least a first layer and a second layer. The first layer comprises a first plurality of electrode segments whereby electrode segments of the first plurality of electrode segments spatially separated from one another along a first direction that is parallel to the planar surface of the chuck. The second layer comprises a second plurality of electrode segments, whereby the second layer is spatially separated from the first layer along a second direction perpendicular to the first direction. The method further includes igniting a plasma using at least the multi-layer segmented electrode while at least two electrode elements in the first layer are controlled by different sets of electrical parameters. The method additionally includes performing the processing of the substrate employing the plasma.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
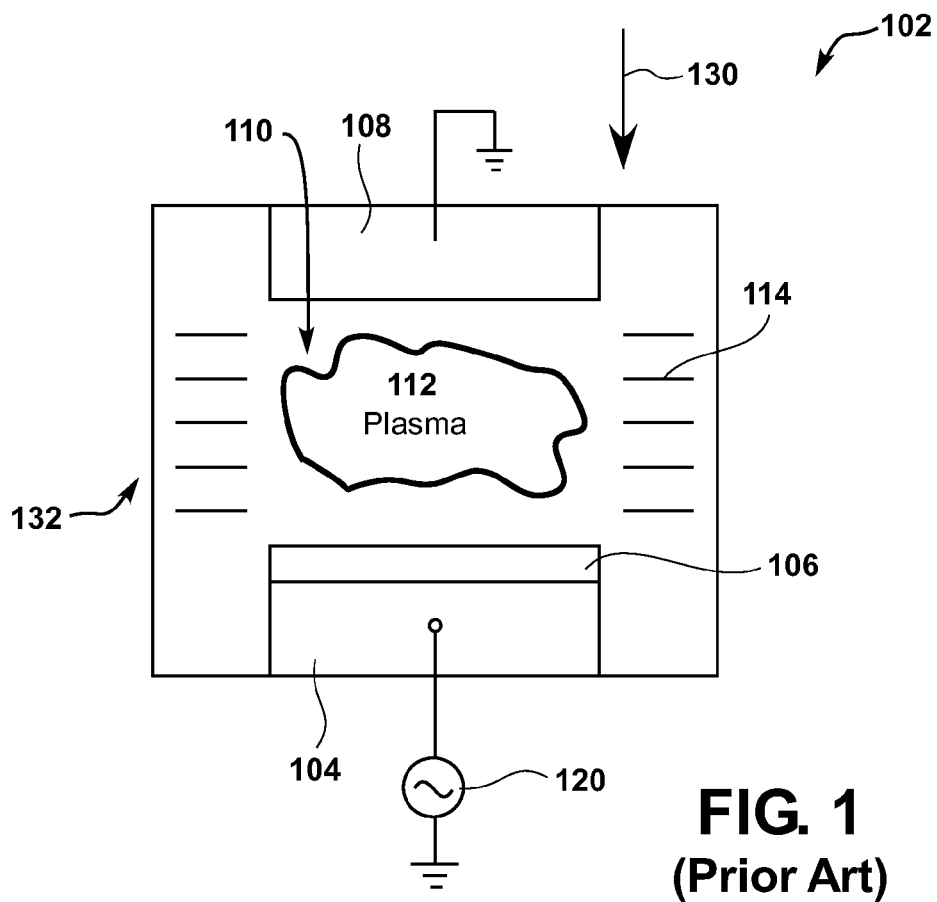
FIG. 1 shows a highly simplified drawing of an example prior art capacitively coupled plasma (CCP) processing chamber to facilitate discussion.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatus for improving process uniformity and more particularly radial process uniformity across a substrate surface. In one or more embodiments, an improved plasma processing system is proposed in which at least one of the process chambers is equipped with one or more multi-layer segmented electrodes. The term "multi-layer" in the term "multi-layer segmented electrode" denotes that the number of layers is greater than 1 in embodiments of the invention. Further, the term "segmented electrode" in the term "multi-layer segmented electrode" denotes that multiple electrode segments exist in each layer of the multi-layer segmented electrode. The layers are spatially separated in the chamber axis direction (i.e., the layers are spatially separated in the direction parallel to the vector that is perpendicular to the surface of the chuck supporting the substrate). The multi-layer segmented electrode permits localized control of the electrode segments that are arranged in multiple layers.

In one or more embodiments, two layers are employed for the multi-layer segmented electrode of the plasma processing chamber. In other embodiments, three or more layers may be employed for the multi-layer segmented electrode. Irrespective of the number of layers involved, there exist multiple electrode segments in each layer, with the segments in at least one of the layers (or in more than one layer or in every layer of the multi-layer segmented electrode) configured to be individually controllable to implement localized control of the plasma formed under the electrode, thereby improving uniformity.

To simplify the illustration, the upper electrode is employed as an example when discussing the multi-layer electrode. However, it should be understood that the same approaches discussed herein may be employed for other electrodes of the chamber (whether for some of those other electrodes or for all of those other electrodes). Further, although a two-electrode chamber is employed to illustrate embodiments of the invention, it should be understood that the same approaches discussed herein may be employed with chambers having more than two electrodes.

Further, although some components are discussed in the examples, it should be understood that a given plasma processing system or chamber may have other components. If a component is not particularly useful to one skilled in the art for understanding the invention, such component is omitted from the discussion for brevity's sake. Accordingly, these examples should not be viewed as limiting as to the scope of the invention.

Returning now to the discussion of the multi-layer segmented electrode, each electrode segment may be controlled by, for example, varying the frequency of the RF signal, the phase of the RF signal, the power level of the RF signal, the RF current, the RF voltage, or the impedance. Varying the impedance is also a control technique when the individual segments are floating. For example, an adjustable capacitor may be provided between an electrode segment and ground in an embodiment. In another embodiment, an LC circuit may be employed to control not only the impedance but also the resonance, if desired.

The electrodes in one layer of the multi-layer segmented electrode may be RF powered while another layer of the multi-layer segmented electrode may be grounded. The RF powered electrode segments may be disposed above (i.e., further away from the plasma) relative to the grounded electrode segments. Alternatively, the RF powered electrode segments may be disposed below (i.e., closer to the plasma) relative to the grounded electrode segments. In these implementations, the number of layers in each electrode is at least two, and the electrode segments in at least one layer, or in more than one layer, or in all the layers may be individually controlled with respect to one or more electrical parameters.

Alternatively, the electrodes in one layer of the multi-layer segmented electrode may be grounded while another layer of the multi-layer segmented electrode may also be grounded. For example, two adjacent layers of the multi-layer electrode may both be grounded. If the upper electrode has only two segmented electrode layers, both layers may be grounded for example. Again, in these implementations, the electrode segments in at least one layer, or in more than one layer, or in all the layers may be individually controlled with respect to one or more electrical parameters.

In one or more embodiments, the electrodes in one layer of the multi-layer segmented electrode may be RF powered while another layer of the multi-layer segmented electrode may also be RF powered. For example, two adjacent layers of the multi-layer electrode may both be RF powered. If the upper electrode has only two layers, both layers may be RF powered in this embodiment. Again, in these implementations, the number of layers in each electrode is at least two, and the electrode segments in at least one layer, or in more than one layer, or in all the layers may be individually controlled with respect to one or more electrical parameters.

In one or more embodiments, the electrodes in adjacent layers of the multi-layer segmented electrode may be configured in a push-pull RF arrangement. Again, in these implementations, the number of layers in each electrode is at least two, and the electrode segments in at least one layer, or in more than one layer, or in all the layers may be individually controlled with respect to one or more electrical parameters.

Alternatively or additionally, it is not a limitation that all segments of a single layer must all be RF powered or that all segments of a single layer must all be grounded. In an embodiment, one or more segments of a given layer may be RF powered, while one or more segments of the same layer may be grounded. The other layer(s) may have its/their electrode segment(s) similarly configured or configured in any of the configurations discussed earlier. Again, in these implementations, the number of layers in each multi-layer segmented electrode is at least two, and the electrode segments in at least one layer, or in more than one layer, or in all the layers may be individually controlled with respect to one or more electrical parameters.

In one or more embodiments, the electrode segments, while arranged in different layers, overlap when viewed in the direction parallel to the chamber axis (i.e., in the direction perpendicular to the planar surface of the chuck that supports the substrate). In other embodiments, the electrode segments, while arranged in multiple layers, do not necessarily overlap when viewed in the direction parallel to the chamber axis.

In one or more embodiments, the segments of a given layer of the multi-layer electrode may be planar relative to one another (i.e. all segments of this layer exist on the same plane). In one or more embodiments, this plane is parallel to the chuck planar surface. In one or more embodiments, this plane is not parallel (i.e., at an angle other than parallel) to the chuck planar surface. In one or more embodiments, the segments of a given layer of the multi-layer electrode may be non-planar relative to one or more of the other segments of the same layer (i.e. electrode segments of this layer are disposed on an imaginary or actual non-planar surface).

These and other features and advantages of embodiments of the invention may be better understood with reference to the figures and discussions that follow.

To facilitate understanding, some general background information may be useful at this point. One approach to improving process result uniformity (e.g., radial etch uniformity) has been to employ a segmented upper electrode whereby the segments are arranged in a single layer. To facilitate discussion, FIG. 2A shows a top down view (along the direction of arrow 130 in FIG. 1) of a prior art single-piece (i.e., non-segmented) planar upper electrode 202 in FIG. 2A. In contrast, FIG. 2B shows the same top-down view (arrow 130 of FIG. 1 again) of an example prior art segmented planar upper electrode 204 comprising segments 204A, 204B, 204C, and 204D. Process result uniformity across the substrate and specifically in the radial direction may be manipulated by controlling each upper electrode segment (e.g., 204A, 204B, 204C, 204D) individually. Note that in both FIGS. 2A and 2B, the RF rods/conductors are not shown to simplify the drawings.

Figure 2A:
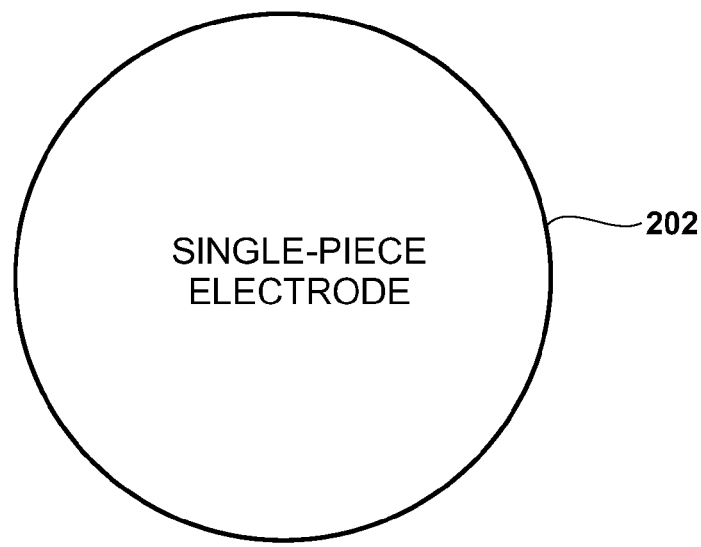
FIG. 2A shows a top down view of a prior art single-piece planar upper electrode.
Figure 2B:
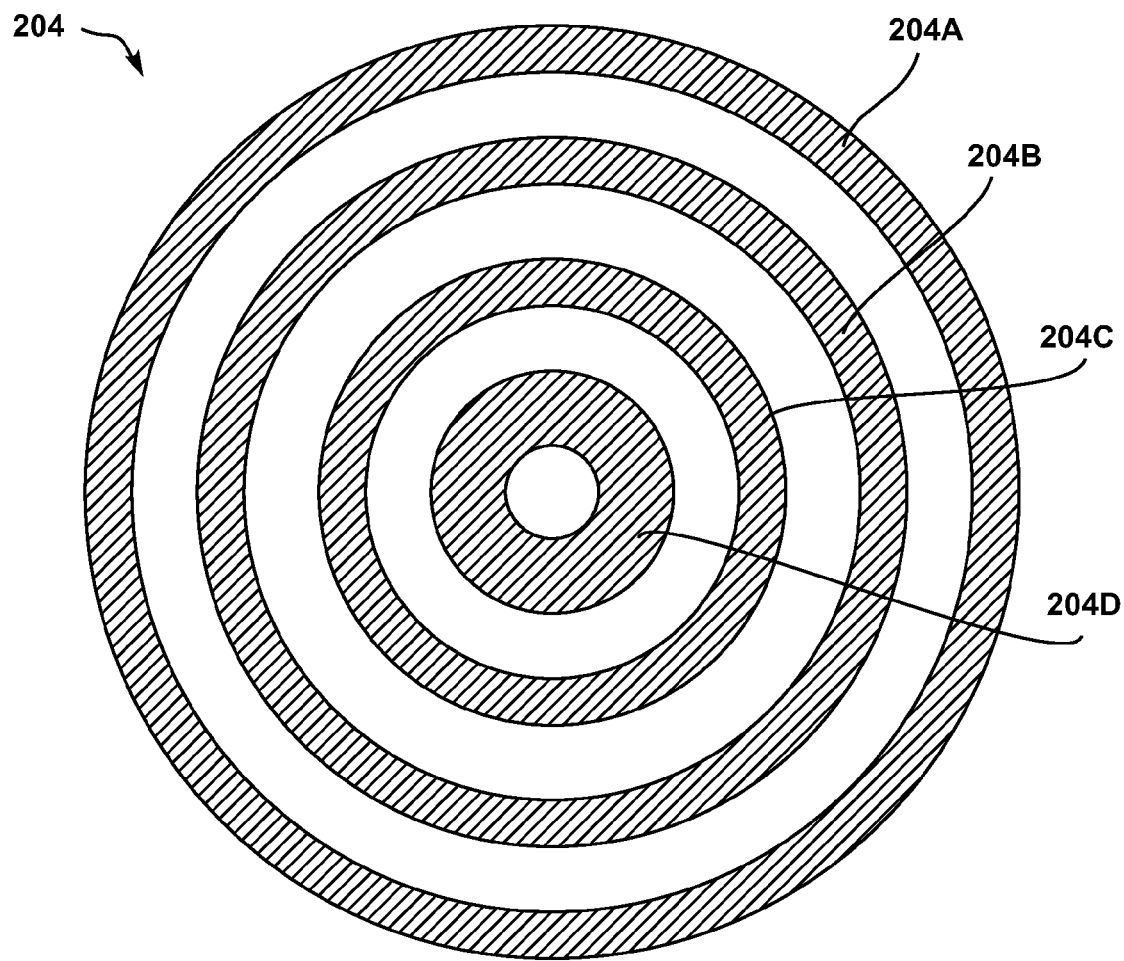
FIG. 2B shows a top-down view of an example prior art segmented planar upper electrode.
Figure 2C:
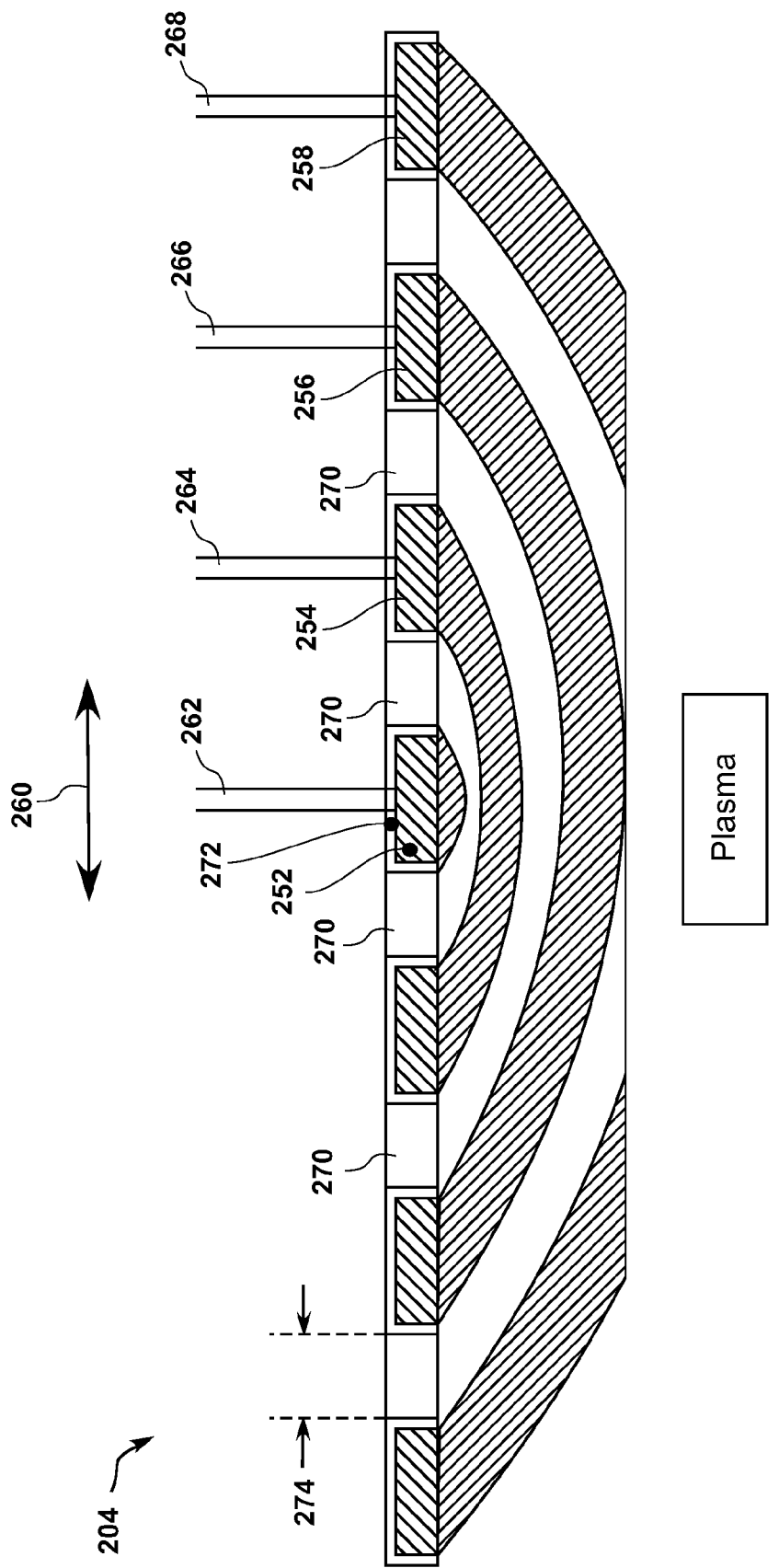
FIG. 2C shows a simplified cut-away side view of a prior art segmented planar electrode.

FIG. 2C shows a simplified cut-away side view of a prior art segmented planar electrode 204, viewed along the direction of arrow 132 of FIG. 1. The electrode segments are shown by reference numbers 252, 254, 256 and 258. Each of electrode segments 252, 254, 256, and 258 is coupled to one of RF rods 262, 264, 266, and 268 respectively in the example of FIG. 2C. Each of electrode segments 252, 254, 256 and 258 may be individually controlled via RF rods 262, 264, 266, and 268. FIG. 2C also shows grounded component 270 disposed between adjacent electrode segment pairs to provide an RF current return path from the plasma.

Further, to minimize RF cross-talk between electrodes and to reduce excessive RF coupling to grounded component 270 (which would degrade the localized control aspect), each of electrode segments 252, 254, 256 and 258 is RF-insulated using a suitable RF insulation material, and adjacent electrode segments are physically separated from one another in the radial direction (in the direction of arrow 260 in FIG. 2C).

In the example of FIG. 2C, an insulating quartz "envelope" is shown adjacent to the non-plasma-facing surfaces of each electrode segment. For example, insulating envelope 272 is seen disposed adjacent to the non-plasma-facing surfaces of electrode segment 252. The insulating envelope (272) also allows more of the RF energy to be coupled from the electrode segment to the plasma instead of to the adjacent ground of grounded component 270. The distance between adjacent electrode segments is depicted in the example of FIG. 2 by reference number 274. The use of insulating envelope 272 and separation distance 274 helps reduce RF cross-talk between adjacent electrode segments and excessive coupling to ground, thereby improving localized control of the electrode segments.

It has been found, however, that those RF insulators and separation distances (e.g., 272 and 274 of FIG. 2C) between adjacent electrode segments "imprint" a non-uniform pattern on the plasma. It is believed by the inventor herein that the non-uniform (e.g., ring-like in some cases) pattern imprinted on the plasma is a result of the imposition of the RF insulation material and the separation distances between adjacent electrode segments of electrode 204. Further, it is believed by the inventor herein that the imprinted non-uniform pattern contributes to reduced radial uniformity of the process result on the substrate. While this degradation in the radial uniformity is undesirable generally, this radial uniformity degradation can be a significant problem when processing larger substrates (e.g., 300 mm or above).

Contrarily, embodiments of the invention utilize a multi-layer segmented electrode approach in which some or all electrode segments of a layer may be individually controllable. The multi-layer segmented electrode advantageously avoids many of the disadvantages associated with the single-layer segmented electrode of FIGS. 2B and 2C, as will be discussed later herein.

As the term is employed herein, an electrode segment or a group of electrode segments is deemed individually controllable or is individually controlled or controllable or controlled when that electrode segment or group of electrode segments is provided with a signal (or ground) that is different with respect to one or more electrical characteristics (e.g., with respect to frequency, phase, voltage, current, impedance, etc.) when compared to electrical characteristics of at least another signal provided to another electrode segment or another group of electrode segments. The control may be static in that such electrical characteristics are set at installation or during maintenance, or may be dynamic in that such electrical characteristics may be changed during use. If dynamic, the change in such electrical characteristics may be made manually or automatically in response to commands from process control computers, for example.

Figure 3:
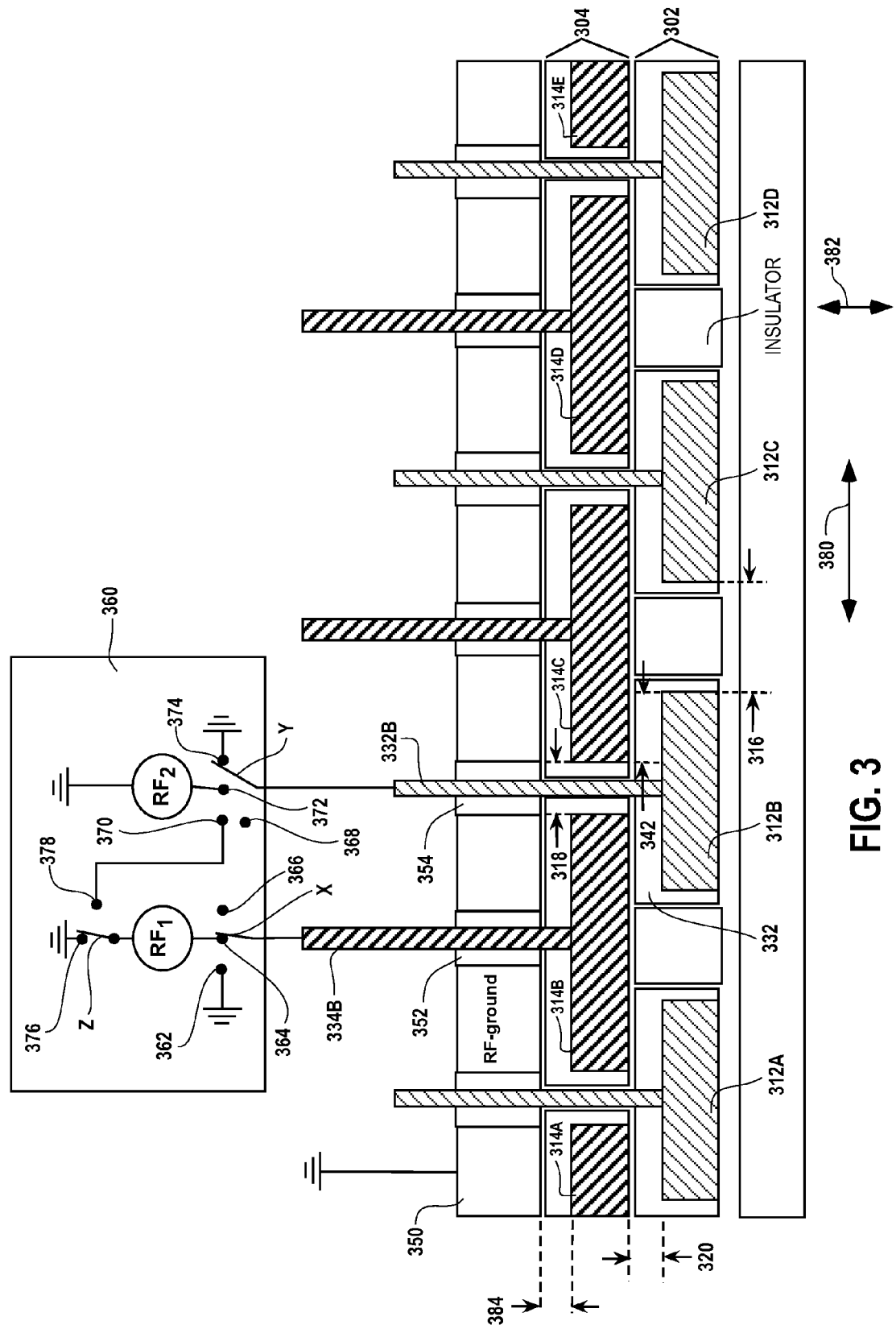
FIG. 3 shows, in accordance with an embodiment of the invention, a simplified cut-away side view of the multi-layer segmented electrode.

FIG. 3 shows, in accordance with an embodiment of the invention, a simplified cut-away side view of the multi-layer segmented electrode, which is implemented for the upper electrode in this example (although the upper electrode implementation is not a limitation and other electrodes may be constructed as multi-layer segmented electrodes if desired).

In the example of FIG. 3, two layers 302 and 304 of electrode segments are shown although the number of layers can be any integer greater than 1 (e.g., 2, 3, 4, etc.). Layer 302 comprises a plurality of concentric segments in the example of FIG. 3, of which segments 312A, 312B, 312C, and 312D are shown. The number of segments in layer 302 can be any integer greater than 1 and thus four is not a limitation but is only an example. Likewise, layer 304 comprises plurality of concentric segments of which segments 314A, 314B, 314C, 314D, 314E are shown. Likewise, the number of segments in layer 304 can be any integer greater than 1 and thus five is not a limitation but is only an example. Further, although the number of segments in two layers may be equal, there is no requirement that layer 302 and layer 304 must have the same number of segments. Further, although electrode segments of the same layer may have the same width or thickness, such is not an absolute requirement and different electrode segments of the same layer or of different layers may have different width and/or thickness dimensions and/or made of different conductive materials.

Adjacent electrode segments 312B and 312C of layer 302 are shown separated by an inter-segment distance 316, which is oriented along a direction 380 parallel to the chuck planar surface. If layer 302 is planar, the separation between adjacent electrode segments is considered to be along the direction formed by the layer plane of layer 302. Other adjacent segments of layer 302 are also separated by inter-segment distances.

Adjacent electrode segments 314B and 314C of layer 304 is shown separated by an inter-segment distance 318, which is oriented along a direction 380 parallel to the chuck planar surface. Other adjacent segments of layer 304 are also separated by inter-segment distances. Preferably, all the inter-segment distances of a given layer are equal. Alternatively, the distances between different adjacent pairs of a layer can differ in one or more embodiments.

The electrode segments may be formed of a conductive material including for example one or more of conductive silicon, silicon carbide, or metal such as aluminum. In one or more embodiments, the plasma-facing surface of the electrode segment(s) may be coated with a plasma process compatible and/or etch resistant coating if desired.

Each electrode segment (e.g., 312B) is surrounded by an insulating material (332) such that the segments are at least RF-insulated from one another in both the radial direction 380 (i.e., the direction that is parallel to the chuck planar surface) and the vertical direction 382 (i.e., the direction that is perpendicular to the chuck planar surface). The insulating material also provides mechanical and/or structural support and/or a fastening base for the segments. The insulating material may be, for example, quartz, ceramics, plastic, or another suitable material. Additionally or alternatively, insulating envelopes (similar to envelope 272 of FIG. 2C) may be employed.

Electrode segments in layer 302 and layer 304 are separated by an inter-layer distance 320, which is oriented along a direction 382 perpendicular to the chuck planar surface. The inter-segment distances (e.g., 316 or 318) and inter-layer distances (e.g., 320) contribute to a reduction of the aforementioned RF cross-talk. Although RF cross-talk cannot be totally eliminated by these distances, these distances may be properly dimensioned to achieve an acceptable level of cross-talk while allowing for acceptable individual control of the electrode segments and/or minimizing non-uniformity and/or optimal overall electrode size. The proper or optimal inter-segment distance(s) and inter-layer distance(s) depend on the chamber design, RF frequencies used, the type of insulator employed, etc., and optimizing these distances is within the skills of one skilled in the art given this disclosure.

Each electrode segment (e.g., 312C of layer 302 or 314C of layer 304) may be coupled to one or more RF rods. For example, electrode segment 312B is shown coupled to RF rod 332B while electrode segment 314B is shown coupled to RF rod 334B. The RF coupling may also be accomplished by conductors having other shapes, including a solid vertical cylinder or cone coupled to a segment to bring RF power to the segment from the top, if desired. The use of multiple rods per segment or a solid cylinder or cone shaped RF coupler reduces or eliminates "RF hotspots" on the segments, in one or more embodiments.

In the example of FIG. 3, segments of different layers are shown overlapping when viewed along the direction parallel to the chamber axis 382 (i.e., the vertical direction or the direction perpendicular to the chuck planar surface). For example, segment 312B of layer 302 and segment 314B of layer 304 are shown overlapping when viewed in the direction of arrow 382. The overlapping portions are shown by reference number 342. Such overlapping is advantageous in that the plasma sees no gap in electrode coverage (i.e., when viewed along the direction of arrow 382). By appropriately controlling the segments individually in the various layers, radial non-uniformity is substantially reduced.

However, it is possible to implement the multi-layer segmented electrode such that, in one or more embodiments, segments of different layers do not overlap when viewed in the direction parallel to the chamber axis (direction of arrow 382). In other words, overlapping distance 342 may be made zero, if desired, in one or more embodiments. The multi-layer segmented electrode may also be constructed such that there is a small gap between segments of the various layers when viewed in the direction of arrow 382. Although these non-overlapping implementations may be non-optimal with respect to certain metrics (such as the maximum reduction of radial non-uniformity), such implementation may have less RF cross-talk, for example, since a segment of one layer is further separated from a segment of another layer in the radial direction 380 (the direction parallel to the chuck planar surface) and may be a worthwhile tradeoff, in one or more embodiments.

A ground plane 350 is shown disposed above layers 302 and 304. The returning RF field may capacitively couple from the plasma to this ground plane 350 to form part of the RF current return path. A design consideration would be to make layers 302 and 304 (such as the segmented electrodes of layers 302 and 304 and/or the inter-layer distance 320 and/or distance 384) sufficiently thin to provide an adequate RF return current path but also sufficiently physically separated to avoid undue cross-talk. Such optimization depends on the chamber design, RF frequencies used, the type of insulator employed, etc., and is within the skills of one skilled in the art given this disclosure.

Various channels are formed in ground plane 350 (such as channel 352 and 354) to accommodate the RF rods. Gas may be fed through gas conduits (not shown) disposed in channels created at least in the insulating portion of layers 302 and 304. Since these gas conduits are disposed close to the electrode segments, it is a design consideration to design these gas conduits and to dispose them at locations that minimize the inadvertent ignition of plasma in the gas conduits. Examples of techniques for reducing the likelihood of unwanted plasma ignition in the gas conduit channels formed to the multi-layer segmented electrode include employing a large number of gas conduits of small diameters which suppress plasma ignition inside the conduits and/or using plasma chokes inside the conduits, etc.

Generally speaking, each segment can be supplied with its control circuit. The control circuit can be an RF power supply (including an RF generator and/or RF match), ground, ground with fixed impedance, ground with variable impedance, or a circuit to modify one or more electrical parameters (e.g., phase, frequency, voltage, current, etc.) of a common RF feed, etc. The point is each segment can be individually controlled, if desired.

When the RF segments are powered, for cost and other reasons, it may be practical to control groups of segments together using a single RF power supply, for example. For example, all or a subset of all segments of one layer (e.g., layer 302) may be provided with a single RF power supply while all or a subset of all segments of another layer (e.g., layer 304) may be provided with another RF power supply. An RF power supply may directly control a group of segments or differentiated control of segments in that group may be accomplished by using electrical parameter varying devices that vary, for example, the phase and/or voltage of the RF signal provided by that RF power supply so that different segments of that group receive RF signals having different electrical parameters.

The point is while control of the RF powered segments can be individualized, it is possible to accomplish this control without employing one RF power supply for each segment. It is also possible to control groups of segments together instead of controlling each individual segment, if desired. Further, the invention supports RF pulsing of the segments. For example, the segments can be pulsed individually, pulsed together as a group, pulsed together as a layer, or different layers can be pulsed together. The pulsing of the various segments/groups/layers can be done synchronously or asynchronously, if desired.

In the example of FIG. 3, the electrode segments of layer 302 may be RF powered while the electrode segments of layer 304 may be grounded. Alternatively, the electrode segments of layer 302 may be grounded while the electrode segments of layer 304 may be RF powered. Alternatively, the electrode segments of layer 302 may be RF powered by one RF power supply while the electrode segments of layer 304 may also be RF powered by a different RF power supply. Alternatively, the electrode segments of layer 302 may be grounded while the electrode segments of layer 304 may also be grounded. It should be understood that while these examples pertain to control of the segments of each layer together, individual segments in each layer and/or groups of segments in each layer may be individually controlled with respect to one or more electrical parameters, if desired, to improve radial uniformity of process result on the substrate.

Although the example of FIG. 3 shows two planar layers 302 and 304, such is not a limitation, and the number of electrode layers and/or the number of planes on which the electrodes are disposed may be any number greater than 1 (i.e., 2 or above). Further, although FIG. 3 shows the segments of each layer (e.g., layer 302 and layer 304) are disposed planarly (i.e., on an imaginary planar surface), the segments of a layer of the multi-layer segmented electrode may be non-planarly disposed such that the layer as a whole lies on an imaginary or actual non-planar surface in one or more embodiments. Further, all layers may be non-planar, or all layers may be planar, or a subset of all layers of the multi-layer segmented electrode may be non-planar while another subset may be planar. Possible example non-planar shapes for one or more or all layers of the multi-layer segmented electrode include, for example, dome or bowl or staircase shapes.

In one or more embodiments, a multi-mode control circuit can be employed to switch a multi-layer segmented electrode to operate in different operating modes. When such a multi-mode control circuit is employed, the same chamber may advantageously be configured to operate in different electrode modes simply by reconfiguring the switch. FIG. 3 shows such a multi-mode control circuit 360.

For example, when switch X is coupled to ground (terminal 362) and switch Y is coupled to RF generator RF2 (terminal 372), segment 314B of layer 304 is coupled to ground while segment 312B of layer 302 is powered by RF generator RF2. Other segments of layer 304 may be controlled by a signal that is the same as or by signals that are derivatives of the signal supplied to segment 314B, for example in one or more embodiments. Other segments of layer 302 may be controlled by a signal that is the same as or by signals that are derivatives of the signal supplied to segment 312B, for example in one or more embodiments.

As another example, when switch X is coupled to RF generator RF1 (terminal 364) and switch Y is coupled to ground (terminal 374), segment 314B of layer 304 is powered by RF1 while segment 312B of layer 302 is coupled to ground. Other segments of layer 304 may be controlled by a signal that is the same as or by signals that are derivatives of the signal supplied to segment 314B, for example in one or more embodiments. Other segments of layer 302 may be controlled by a signal that is the same as or by signals that are derivatives of the signal supplied to segment 312B, for example in one or more embodiments.

As another example, when switch X is coupled to ground (terminal 362) and switch Y is coupled to ground (terminal 374), segment 314B of layer 304 is coupled to ground while segment 312B of layer 302 is also coupled to ground. Other segments of layer 304 may be controlled by a signal that is the same as or by signals that are derivatives of the signal supplied to segment 314B, for example in one or more embodiments. Other segments of layer 302 may be controlled by a signal that is the same as or by signals that are derivatives of the signal supplied to segment 312B, for example in one or more embodiments.

As another example, when switch X is coupled to RF1 (terminal 364) and switch Y is coupled to RF2 (terminal 372), segment 314B of layer 304 is powered by RF1 while segment 312B of layer 302 is powered by RF2. Other segments of layer 304 may be controlled by a signal that is the same as or by signals that are derivatives of the signal supplied to segment 314B, for example in one or more embodiments. Other segments of layer 302 may be controlled by a signal that is the same as or by signals that are derivatives of the signal supplied to segment 312B, for example in one or more embodiments.

As another example, when switch X is coupled to terminal 378 (instead of ground 376) and switch Y is coupled to terminal 370, segment 314B of layer 304 and segment 312B of layer 302 operate in a push-pull arrangement. Other segments of layer 304 may be controlled by a signal that is the same as or by signals that are derivatives of the signal supplied to segment 314B, for example in one or more embodiments. Other segments of layer 302 may be controlled by a signal that is the same as or by signals that are derivatives of the signal supplied to segment 312B, for example in one or more embodiments.

Terminals 366 and 368 are shown to illustrate that one or both of segments 314B and 312B may be made floating, if desired. Although only two RF supplies are shown in the multi-mode control circuit 360 of FIG. 3, additional RF supplies may also be employed to control other segments of the multi-layer segmented electrode. Additionally, each of the RF supplies may be an RF source that can supply one or more RF frequencies to a segment, in one or more embodiments. In other words, it is not a limitation that a single electrode segment can only be supplied with a single RF frequency.

The insulators that surround the segments can be made of a single-piece or a multi-piece structure if such will simplify manufacturing and/or installation and/or maintenance. Although not shown in the figures to simplify the explanation, heating and/or cooling channels may be provided on top of or through the multi-layer segmented electrode of FIG. 3, if desired.

Figure 4:
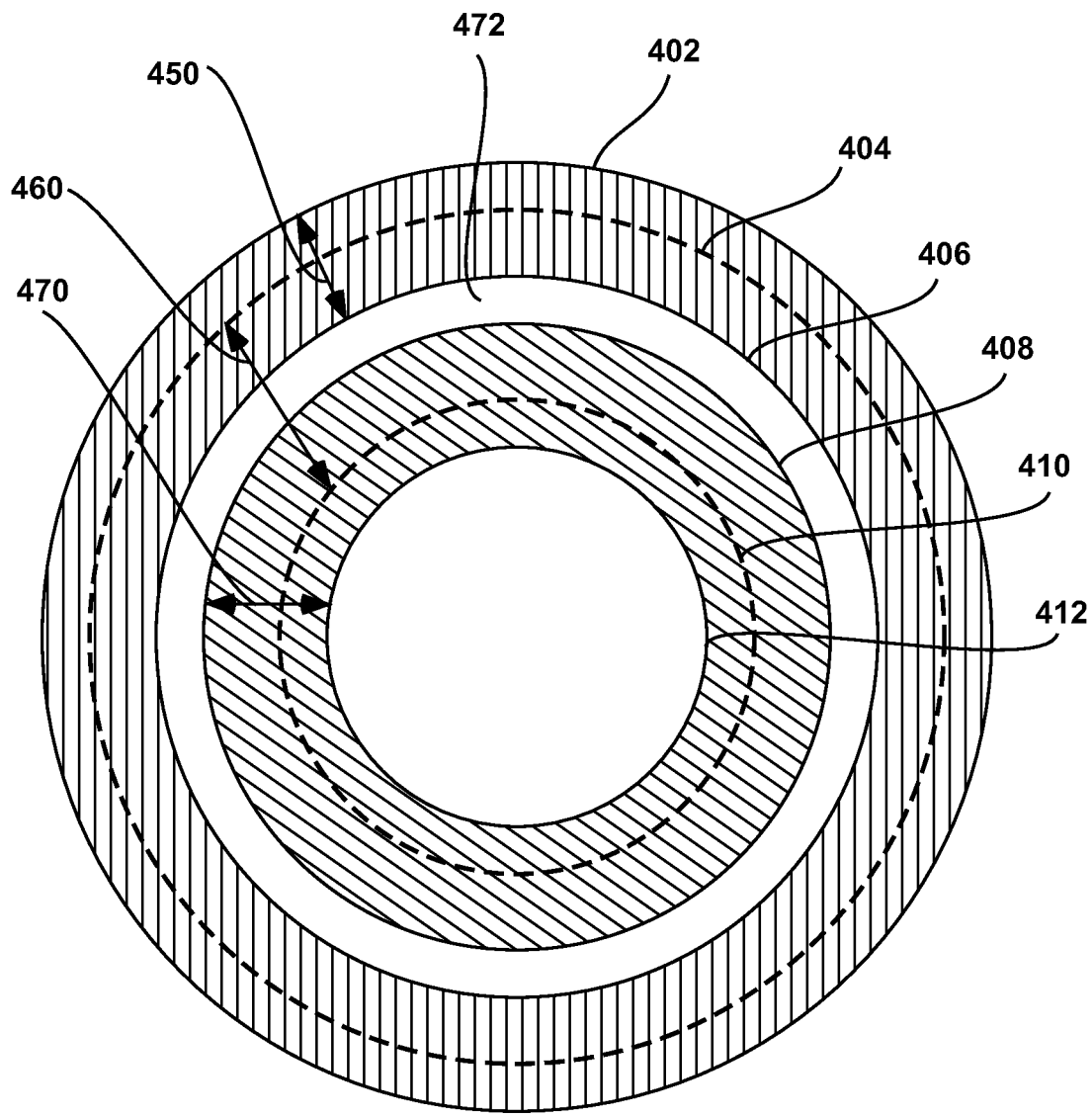
FIG. 4 shows a simplified bottom-up view of three example electrode segments of a portion of an example multi-layer segmented upper electrode, in accordance with an embodiment of the invention.

FIG. 4 shows a simplified bottom-up view of three example electrode segments of a portion of an example multi-layer segmented upper electrode, in accordance with an embodiment of the invention. This would be the view seen from the plasma perspective, looking up at the lower surface of the multi-layer segmented upper electrode, for example.

In the example of FIG. 4, the electrode segments are disc-shaped. As the term is employed herein, an electrode segment is disc-shaped when such electrode segment is delineated by two substantially concentric circles for its inner and outer perimeters and having a thickness that defines the thickness of the electrode segment. With respect to FIG. 4, disc-shaped electrode segment 450 (delineated between circles 402 and 406) and disc-shaped electrode segment 470 (delineated between circles 408 and 412) are disposed on the same plane that is closest to the plasma in this example. Disc-shaped electrode segment 460 (delineated between dashed circles 404 and 410) is disposed above the plane that contains electrode segment 450 and 470 (i.e., electrode segment 460 is further away from the plasma). As shown, the electrodes are concentrically disposed relatively to one another when viewed from an axial direction (i.e., along a vector that is normal to the electrode plane). Also, the electrode segments of one layer are interleaved with electrode segments of another layer along the radial direction (albeit separated in the axial direction) in an overlapping manner (as shown in FIG. 4) or in a non-overlapping manner if desired. To clarify, the axial direction is the direction looking into or out of the page in FIG. 4, while the radial direction would be parallel to the page plane. With respect to FIG. 4, the region between circles 406 and 408 would house the insulating material that spatially separates electrode segment 450 and electrode segment 470 at least in the radial direction.

As can be appreciated from FIG. 4, the plasma faces both electrode segments 450 and 470 and at least a portion of electrode segment 460 (through the insulating material in the gap between electrode segments 450 and 470, even though electrode segment 460 resides on a different plane). Accordingly, as far as the plasma is concerned, it is as if there are no radial gaps among the electrode segments. This is unlike the situation in prior art FIG. 2B, where gaps between adjacent electrodes (such as electrodes 204B and 204C) would result in a vastly more pronounced imprint on the plasma.

Further, since electrode segment 460 exists on a different plane relative to electrode segments 450 and 470, spatial separation between the electrode segments is advantageously preserved to minimize cross-talk. The vertical separation between electrode segment pair 460/450 reduces the RF cross-talk between this electrode segment pair. The vertical separation between electrode segment pair 460/470 reduces the RF cross-talk between this electrode segment pair. The radial separation between electrode segment pair 450/470 reduces the RF cross-talk between this electrode segment pair. In this manner, although the plasma is "fooled" into seeing no radial gap between the electrode segments 450, 460, and 470, RF cross-talk among electrode segments is still reduced, thereby facilitating local control of the individual electrode segments to improve uniformity tuning.

Figure 5:
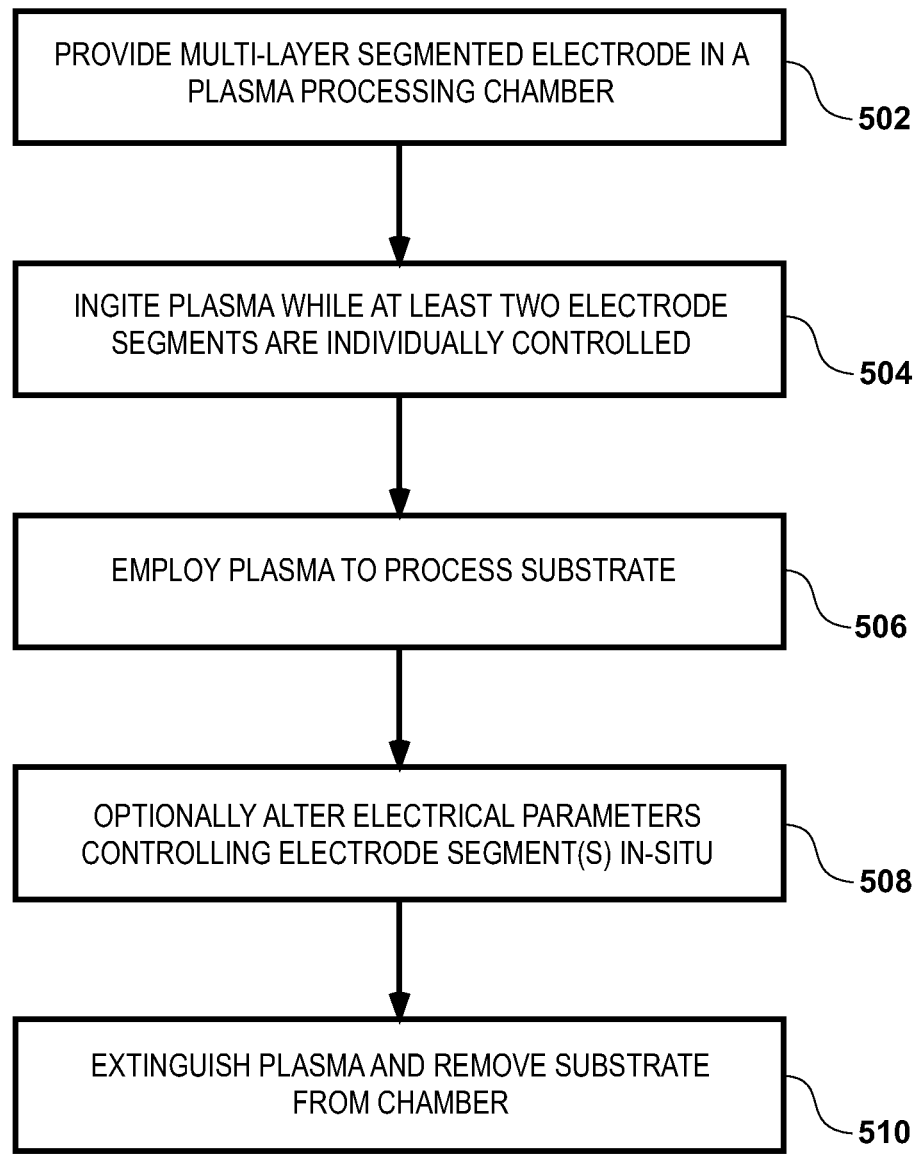
FIG. 5 shows, in accordance with an embodiment of the invention, a method for processing a substrate using the multi-layer segmented electrode in a plasma processing chamber.

FIG. 5 shows, in accordance with an embodiment of the invention, a method for processing a substrate using the multi-layer segmented electrode in a plasma processing chamber. The steps herein are only representative in an example and other known steps may be performed in between the steps discussed below.

In step 502, a multi-layer segmented electrode having electrode segments in at least two layers (i.e., the number of layers is greater than 1) is provided in a plasma processing chamber.

In step 504, a plasma is ignited while at least two or more electrode segments are individually controlled. In an example of step 504, a plasma is ignited while at least two electrode segments in the same layer of the multi-layer segmented electrode are individually controlled with different electrical parameters. With respect to FIG. 4, these two adjacent electrode segments may represent electrode segments 450 and 470, for example. Optionally in step 504 and in addition, at least one electrode segment (e.g., electrode segment 460) that is disposed adjacent in the radial direction to (but axially separated from) one or both of the aforementioned electrodes (e.g., 450 and/or 470) is controlled with the same set of electrical parameters as those electrical parameters controlling one of the two aforementioned electrode segments (e.g., 450 and/or 470) or with a different set of electrical parameters.

In step 506, the plasma of step 504 is employed to process (such as etch) a substrate. Since the multi-layer segmented electrode provides differentiated control of the electrode segments in a manner that does not "imprint" the insulator pattern on the plasma (as would be the case for the prior art single-layer segmented electrode of FIG. 2B), improved uniformity is achieved.

In an optional step 508, the electrical parameters controlling one or more electrode segments may be altered in-situ. Such change may be made in response to control signals from the tool control computer to facilitate the transition from one etch step to another etch step, for example. Such a change, accomplished by manipulating the electrical parameters controlling the electrode segments, ensures that each processing step would be accomplished with an optimal uniformity profile for that specific processing step. Multiple such changes may be made while processing a single substrate in the plasma chamber, in one or more embodiments.

In step 510, the plasma is extinguished and the substrate may be removed from the chamber for additional processing (such as cutting) to eventually form electronic devices.

As can be appreciated from the foregoing, embodiments of the invention facilitate improved control of process result and particularly improved control of radial uniformity without suffering the disadvantages associated with the single-piece electrode design or the single-layer segmented electrode design. Numerous other refinements discussed herein provide a greater degree of optimization for various implementations of the innovative multi-layer segmented electrode. Although each refinement or option or feature is discussed individually for clarity, individual ones or groups of these refinements or options or features discussed in this disclosure may be combined in any suitable combination in any multi-piece segmented electrode to optimize uniformity control and/or control of any other process parameter or process result as desired.

While this invention has been described in terms of several preferred embodiments, there are alterations, permutations, and equivalents, which fall within the scope of this invention. If the term "set" is employed herein, such term is intended to have its commonly understood mathematical meaning to cover zero, one, or more than one member. The invention should be understood to also encompass these alterations, permutations, and equivalents. It should also be noted that there are many alternative ways of implementing the methods and apparatuses of the present invention. Although various examples are provided herein, it is intended that these examples be illustrative and not limiting with respect to the invention.

What is claimed is:

1. A multi-layer segmented electrode defining an upper electrode of a plasma processing chamber, the upper electrode disposed above a substrate support that defines a lower electrode of the plasma processing chamber, the multi-layer segmented electrode, comprising:
    a first layer comprising a first plurality of electrode segments wherein electrode segments of said first plurality of electrode segments are spatially separated from one another along a first direction;
    a second layer comprising a second plurality of electrode segments, wherein said second layer is spatially separated from said first layer along a second direction perpendicular to said first direction, and wherein respective ones of said second plurality of electrode segments are interleaved from respective ones of said first plurality of electrode segments in the first direction, wherein said first direction is a direction parallel to a layer plane of said first layer, and wherein at least two segmented electrodes of said first plurality of electrode segments are individually controllable.

2. The multi-layer segmented electrode of claim 1, wherein said at least two electrode segments of said first plurality of electrode segments are controllable by different sets of electrical parameters when said multi-layer segmented electrode is employed in the plasma processing chamber for processing the substrate.

3. The multi-layer segmented electrode of claim 1, wherein said first layer is planar.

4. The multi-layer segmented electrode of claim 1, wherein said first layer is non-planar.

5. The multi-layer segmented electrode of claim 1, wherein said electrode segments of said first plurality of said electrode segments are interleaved in an overlapping manner with said electrode segments of said second plurality of electrode segments.

6. The multi-layer segmented electrode of claim 1, wherein said electrode segments of said first plurality of said electrode segments are interleaved in a non-overlapping manner with said electrode segments of said second plurality of electrode segments.

7. The multi-layer segmented electrode of claim 1, wherein said electrode segments of said first plurality of said electrode segments are grounded and wherein said electrode segments of said second plurality of electrode segments are RF-powered.

8. The multi-layer segmented electrode of claim 1, wherein said electrode segments of said first plurality of said electrode segments are grounded and wherein said electrode segments of said second plurality of electrode segments are also grounded.

9. The multi-layer segmented electrode of claim 1, wherein said electrode segments of said first plurality of said electrode segments are RF-powered and wherein said electrode segments of said second plurality of electrode segments are also RF-powered.

10. The multi-layer segmented electrode of claim 1, wherein at least one electrode segment of said first plurality of said electrode segments and at least one electrode segment of said second plurality of electrode segments are coupled to an RF power supply in a push-pull arrangement.

11. A plasma processing system having a plasma processing chamber for performing plasma processing on a substrate, the plasma processing chamber comprising:
    a plasma processing chamber;
    a chuck disposed in said plasma processing chamber, said chuck having a planar surface and configured to support said substrate on said planar surface in said plasma processing chamber during said plasma processing; and
    a multi-layer segmented electrode disposed within said plasma processing chamber, said multi-layer segmented electrode including an upper electrode of said plasma processing chamber, the upper electrode disposed above the chuck that defines a lower electrode of the plasma processing chamber, the multi-layer segmented electrode comprising at least:
    a first layer comprising a first plurality of electrode segments wherein electrode segments of said first plurality of electrode segments are spatially separated from one another along a first direction that is parallel to said planar surface of said chuck, and
    a second layer comprising a second plurality of electrode segments, wherein said second layer is spatially separated from said first layer along a second direction perpendicular to said first direction, and wherein respective ones of said second plurality of electrode segments are interleaved from respective ones of said first plurality of electrode segments in the first direction, wherein said first direction is a direction parallel to a layer plane of said first layer, and wherein at least two segmented electrodes of one of said first plurality of electrode segments and said second plurality of electrode segments are individually controllable by different electrical parameters during said plasma processing.

12. The plasma processing system of claim 11, wherein said first layer is planar.

13. The plasma processing system of claim 11, wherein said first layer is non-planar.

14. The plasma processing system of claim 11, wherein said electrode segments of said first plurality of said electrode segments are interleaved in an overlapping manner with said electrode segments of said second plurality of electrode segments.

15. The plasma processing system of claim 11, wherein said electrode segments of said first plurality of said electrode segments are interleaved in a non-overlapping manner with said electrode segments of said second plurality of electrode segments.

16. The plasma processing system of claim 11, wherein said electrode segments of said first plurality of said electrode segments are grounded and whereby said electrode segments of said second plurality of electrode segments are RF-powered.

17. The plasma processing system of claim 11, wherein a distance between said first layer and said chuck is shorter than a distance between said second layer and said chuck.

18. The plasma processing system of claim 11, wherein a distance between said first layer and said chuck is longer than a distance between said second layer and said chuck.

19. The plasma processing system of claim 11, wherein said electrode segments of said first plurality of said electrode segments are grounded and wherein said electrode segments of said second plurality of electrode segments are also grounded.

20. The plasma processing system of claim 11, wherein said electrode segments of said first plurality of said electrode segments are RF-powered and wherein said electrode segments of said second plurality of electrode segments are also RF-powered.

21. The plasma processing system of claim 11, wherein at least one electrode segment of said first plurality of said electrode segments and at least one electrode segment of said second plurality of electrode segments are coupled to an RF power supply in a push-pull arrangement.

22. A method for processing a substrate in a plasma processing chamber, said substrate supported on a planar surface of a chuck during said processing, comprising:
providing a multi-layer segmented electrode that defines an upper electrode that is above the chuck and includes at least a first layer and a second layer, said first layer comprising a first plurality of electrode segments wherein electrode segments of said first plurality of electrode segments are spatially separated from one another along a first direction that is parallel to said planar surface of said chuck, said second layer comprising a second plurality of electrode segments, wherein said second layer is spatially separated from said first layer along a second direction perpendicular to said first direction, wherein in the first direction, the first plurality of electrode segments are interleaved with respect to the second plurality of electrode segments;
igniting a plasma using at least said multi-layer segmented electrode while at least two electrode elements in said first layer are controlled by different sets of electrical parameters; and
performing said processing of said substrate employing said plasma.

23. The method of claim 22, further comprising altering at least one electrical parameter of said set of electrical parameters during said processing.

24. The method of claim 22, further comprising providing ground to said electrode segments of said first plurality of electrode segments, said first plurality of electrode segments being disposed between said plasma and said second plurality of electrode segments.

25. The method of claim 22, further comprising providing RF power to said electrode segments of said first plurality of said electrode segments, said first plurality of electrode segments being disposed between said plasma and said second plurality of electrode segments.

26. The method of claim 22, further comprising providing ground to said electrode segments of said first plurality of said electrode segments and providing RF power to said second plurality of electrode segments.

27. The method of claim 22, further comprising coupling at least one electrode segment of said first plurality of said electrode segments and at least one electrode segment of said second plurality of electrode segments to an RF power supply in a push-pull arrangement.

* * * * *